United States Patent [19]
Nanpei et al.

[11] Patent Number: 5,372,913
[45] Date of Patent: Dec. 13, 1994

[54] PHOTOSENSITIVE RESIN COMPOSITION

[75] Inventors: Masaru Nanpei, Ise; Akira Tomita; Keizo Kawahara, both of Ootsu; Toshihiko Kajima, Okayama, all of Japan

[73] Assignee: Toyo Boseki Kabushiki Kaisha, Japan

[21] Appl. No.: 932,312

[22] Filed: Aug. 19, 1992

Related U.S. Application Data

[62] Division of Ser. No. 523,345, May 14, 1990, abandoned.

[30] Foreign Application Priority Data

| | | | |
|---|---|---|---|
| May 18, 1989 | [JP] | Japan | 1-125673 |
| Aug. 11, 1989 | [JP] | Japan | 1-208616 |
| Oct. 20, 1989 | [JP] | Japan | 1-274649 |
| Nov. 30, 1989 | [JP] | Japan | 1-312810 |
| Dec. 25, 1989 | [JP] | Japan | 1-337990 |
| Dec. 27, 1989 | [JP] | Japan | 1-341926 |

[51] Int. Cl.$^5$ .................. G03C 1/725; G03C 1/73
[52] U.S. Cl. .................. 430/281; 430/138; 430/270; 430/273; 522/109; 522/110
[58] Field of Search .......... 430/270, 281, 273, 138; 522/109, 110

[56] References Cited

U.S. PATENT DOCUMENTS

| | | | |
|---|---|---|---|
| 3,706,593 | 12/1972 | Miyano et al. | 430/138 |
| 3,847,644 | 11/1974 | Erhardt et al. | 430/270 |
| 4,188,223 | 2/1980 | Woodbrey et al. | 430/270 |
| 4,522,910 | 6/1985 | Hallman | 430/270 |
| 4,777,114 | 10/1988 | Ichimura et al. | 430/270 |
| 4,877,714 | 10/1989 | Tsunoda et al. | 430/270 |
| 4,880,721 | 11/1989 | Ishikawa | 430/270 |
| 4,956,252 | 9/1990 | Fryd et al. | 430/138 |
| 5,002,854 | 3/1991 | Fan et al. | 430/270 |

FOREIGN PATENT DOCUMENTS

| | | |
|---|---|---|
| 104751 | 4/1984 | European Pat. Off. . |
| 164270 | 12/1985 | European Pat. Off. . |
| 273393 | 7/1988 | European Pat. Off. . |
| 322585 | 7/1989 | European Pat. Off. . |
| 0351628 | 1/1990 | European Pat. Off. . |

OTHER PUBLICATIONS

*Chemical Abstracts*, vol. 104, No. 18, May 5, 1986, p. 712, Item 159663f.
*Chemical Abstracts*, vol. 90, No. 2, Jan. 8, 1979, p. 551, Item 14662n.
Todd, "Aqueous Photopolymerisable Coating Compositions", No. 18218, *Research Disclosure*, Jun. 1979, pp. 300–301.

*Primary Examiner*—John Kight, III
*Assistant Examiner*—P. Hampton-Hightower
*Attorney, Agent, or Firm*—Wegner, Cantor, Mueller & Player

[57] ABSTRACT

A photosensitive resin composition includes (A) a hydrophobic polymer having a glass transition temperature not greater than 5° C., (B) a hydrophilic polymer, (C) an ethylenically unsaturated compound, (D) a solvent capable of dissolving the component (B) more than the component (A) and (E) a photopolymerization initiator, with the content of component (B) being less than that of component (A). The resin composition can be used to prepare a printing plate having a base, a photosensitive resin layer and a covering layer arranged one over another. The photosensitive resin layer contains a dispersed phase which includes particles having a phase which includes a hydrophobic polymer, surrounded by a phase which includes a hydrophilic polymer. The photosensitive resin layer can be prepared by removing the solvent (D) to a content of 0.001–2% by weight.

6 Claims, 2 Drawing Sheets

PHOTOSENSITIVE RESIN COMPOSITION

This application is a division of Ser. No. 07/523,345 filed May 14, 1990, now abandoned.

BACKGROUND OF THE INVENTION

1. Field of the Invention

The present invention relates to a photosensitive resin composition which is useful for the production of a flexographic printing plate because of its rubber elasticity and good ink resistance and its capability of being developed with an aqueous system. The present invention also relates to a printing plate stock made with said photosensitive resin and a finished printing plate thereof.

2. Description of the Prior Art

Photosensitive resin-based flexographic printing plates hitherto known are designed to be developed with an organic solvent, which poses a problem associated with toxicity and fire hazards and environmental pollution. To address this problem, there have been proposed new photosensitive resin compositions capable of development with an aqueous system, as enumerated below.

(1) One containing a copolymer, a photopolymerizable unsaturated monomer, and a photosensitizer, said copolymer being composed of a conjugated diene hydrocarbon, an $\alpha,\beta$-ethylenic unsaturated carboxylic acid (or a salt thereof), and a monoolefinic unsaturated compound. (Japanese Patent Kokai Nos. 134655/1977, 10648/1978, and 22339/1986)

(2) One containing a polymer of conjugated diene hydrocarbon or a copolymer of conjugated diene hydrocarbon and monoolefinic unsaturated compound, a hydrophilic polymeric compound, a non-gaseous ethylenic unsaturated compound, and a photopolymerization initiator. (Japanese Patent Kokai No. 211451/1985)

(3) One containing a hydrophobic oligomer with an $\alpha,\beta$-ethylenic unsaturated group, a water-swellable elastomeric substance, and a photopolymerization initiator. (Japanese Patent Kokai No. 1703055/1985)

There have also been proposed other new photosensitive resin compositions as enumerated below.

(1) One containing hard organic fine particles, which is intended for the improvement of printing plates in mechanical strength and impact resilience. (Japanese Patent Kokai No. 8648/1988)

(2) One having a two-phase structure of continuous phase and dispersed phase, the former containing a diazo compound and dichromate and the latter containing particles smaller than 10 μm in size. This is intended for the improvement of printing plates in ink receptivity. (Japanese Patent Publication No. 36731/1984)

The former one is capable of development with an aqueous developing solution such as aqueous alkaline solution or with a developing solution composed of an aqueous alkaline solution and an organic solvent, while it can hardly be developed with tap water or pH 5.0-9.0. Moreover, it gives rise to a relief part which lacks a sufficient ink resistance.

The latter one also has a disadvantage. For the composition to be capable of development with an aqueous system, it should contain a hydrophilic component in the continuous phase, and the amount of the hydrophilic component should be larger than that of the component forming the dispersed phase from the standpoint of thermodynamic safety. This leads to an incompatibility of the water-developing performance with the ink resistance of relief parts.

Basically, a photosensitive resin composition should have good light transmission properties and hence should be composed of those components which are highly compatible with one another. This requires that the hydrophilic polymer, which originally has a high polarity in many cases, should be mixed with other components which also have a high polarity. However, this compatibility is not realized in the case where the composition contains a polymer of conjugated diene hydrocarbon, which usually has a low polarity. (In other words, the hydrophilic polymer to be used is limited in its kind and amount.)

SUMMARY OF THE INVENTION

The present inventors carried out a series of researches, which led to the finding that it is possible to solve the above-mentioned problems by controlling the phase structure in the photosensitive resin layer.

It is an object of the present invention to provide a photosensitive resin composition which comprises (A) a hydrophobic polymer having a glass transition temperature not higher than 5° C., (B) a hydrophilic polymer, (C) an ethylenic unsaturated compound, (D) a solvent capable of dissolving said component (B) more than said component (A), and (E) a photopolymerization initiator, with said component (B) being less in content than said component (A).

It is another object of the present invention to provide a printing plate stock composed of a base and a layer of said photosensitive resin formed thereon and a finished printing plate thereof, said photosensitive resin layer being compose of a continuous phase composed mainly of a hydrophobic polymer and a dispersed phase composed of particles surrounded by a phase composed mainly of a hydrophilic polymer.

DETAILED DESCRIPTION OF THE INVENTION

Figure 1:
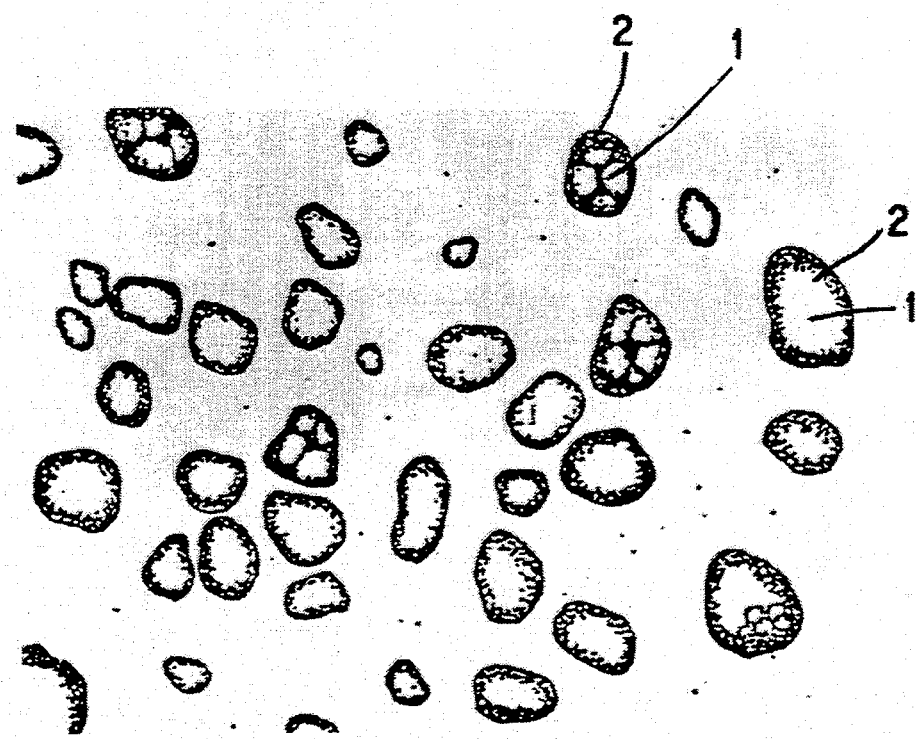
FIGS. 1 and 2 are microphotographs (about 300×) showing a cross-section of the resin layer of the printing plate stock (or finished printing plate).

Component (A) in the photosensitive composition of the present invention is a hydrophobic polymer having a glass transition temperature not higher than 5° C. It includes those which are used as general-purpose elastomers, such as polymers obtained by the polymerization of a conjugated diene hydrocarbon, copolymers obtained by the copolymerization of a conjugated diene hydrocarbon with a monoolefinic unsaturated compound, and polymers containing no conjugated diene hydrocarbons.

Examples of the conjugated diene hydrocarbon include 1,3-butadiene, isoprene, and chloroprene. They may be used alone or in combination with one another.

Examples of the monoolefinic unsaturated compound include styrene, α-methylstyrene, o-methylstyrene, m-methylstyrene, p-methylstyrene, acrylonitrile, methacrylonitrile, vinyl chloride, vinylidene chloride, acrylic acid, methacrylic acid, vinyl acetate, acrylic ester, and methacrylic ester.

Examples of the polymers obtained by the polymerization of a conjugated diene hydrocarbon and the copolymers obtained by the copolymerization of a conjugated diene hydrocarbon with a monoolefinic unsaturated compound include butadiene polymer, isoprene polymer, chloroprene polymer, styrene-butadiene copolymer, styrene-isoprene copolymer, styrene-chloroprene copolymer, acrylonitrile-butadiene copolymer, acrylonitrile-isoprene copolymer, acrylonitrile-chloroprene copolymer, methyl methacrylate-butadiene copolymer, methyl methacrylate-isoprene copolymer, methyl methacrylate-chloroprene copolymer, methyl acrylate-butadiene copolymer, methyl acrylate-isoprene copolymer, methyl acrylate-chloroprene copolymer, acrylonitrile-butadiene-styrene copolymer, acrylonitrile-isoprene-styrene copolymer, and acrylonitrile-chloroprene-styrene copolymer.

Examples of the polymers containing no conjugated diene hydrocarbons include elastomers containing a specific amount of chlorine and polymers of non-conjugated diene hydrocarbon.

The hydrophobic polymer having a glass transition temperature (referred to as Tg hereinafter) not higher than 5° C. contains 10–50 wt % of chlorine and exhibits rubber elasticity. It may be obtained by the polymerization of a monomer containing a chlorine atom or by the copolymerization of a monomer containing a chlorine atom and other copolymerizable monomers. It may also be obtained by the reaction of a chlorine-free polymer with chlorine or a chlorine-containing active substance. Examples of this polymer include the following.

Epichlorohydrin polymer, epichlorohydrin-ethylene oxide copolymer, epichlorohydrin-propylene oxide copolymer, epichlorohydrin rubber containing allyl glycidyl ether, (commercially available under the trade name of "Epichlomar" from Osaka Soda Kogyo Co., Ltd., "Hydrin" from Goodrich Co., Ltd., "Gechron" from Nippon Zeon Co., Ltd., and "Herclor" from Hercules Co., Ltd.) chlorinated polyethylene, (commercially available under the trade name of "Elaslen" from Showa Denko Co., Ltd., "Daisolac" from Osaka Soda Kogyo Co., Ltd., "Hortalitz" from Hoechst Co., Ltd., and "Dowcpe" from Dow Chemical Co., Ltd.) vinyl chloride copolymer, vinylidene chloride, chlorinated polypropylene, and chlorinated ethylene-propylene rubber.

The above-cited polymers may be used alone or in combination with one another. The chlorine content in the polymer should be 10–50 wt %, preferably 15–40 wt %. With a chlorine content outside this range, the polymer is poor in flexibility and heat stability and is liable to give rise to a photosensitive resin composition which is excessively hard and colored.

Incidentally, the chlorine-containing polymer or copolymer of conjugated diene hydrocarbon, which has the carbon unsaturated bond in the main chain, is inferior in chemical stability (such as weathering) to the polymer having the saturated bond alone.

The photosensitive resin composition changes in its physical properties after exposure to light, and the change depends greatly on the properties of component (A). In other words, component (A) should essentially be a rubbery elastic material. This is the reason why component (A) should have a Tg not higher than 5° C., preferably not higher than −10° C.

Component (A) may contain, in addition to the above-mentioned polymer, an elastomer (such as acrylic rubber and polyurethane elastomer) which is highly miscible with the polymer and has good ozone resistance.

The photosensitive composition of the present invention should contain component (A) in an amount more than 20 wt %, preferably more than 30 wt %, so that it provides a finished printing plate superior in physical properties and shape retention. Moreover, it should contain component (A) in an amount less than 80 wt %, preferably less than 70 wt %, from the standpoint of photopolymerization performance.

According to the present invention, component (B) is a hydrophilic polymer. It is a polymer which dissolves or swells (disperses) in water or an aqueous alkaline or acid solution containing an organic solvent and surface active agent, which is used as a developing solution. It has a hydrophilic group such as —OH, —NH$_2$, —COOM, and —SO$_3$M (where M denotes a hydrogen atom, an element of Groups I, II, and III, amine, or ammonium), and is of straight chain structure free of cross-linkage.

Examples of the hydrophilic polymer include polyvinyl alcohol (PVA), carboxymethyl cellulose, diene rubber copolymerized with (meth) acrylic acid and diene compound, and liquid polybutadiene modified with maleic anhydride. A preferred hydrophilic polymer is one which contains —COOM (where M denotes a hydrogen atom, an element of Groups I, II, and III, amine, or ammonium) in an amount of 50–50,000 equivalents/$10^6$ g. (Examples of the elements denoted by M include alkali metals (such as sodium, potassium, and lithium), alkaline earth metals (such as calcium and magnesium), boron, and aluminum. With an amount of —COOM less than 50 equivalents/$10^6$ g, the hydrophilic polymer is poor in affinity for water, which impedes development with neutral water. With an amount in excess of 50,000 equivalents/$10^6$ g, the resulting finished printing plate is poor in ink resistance.

Examples of the hydrophilic polymer include —COOM group-containing polyurethane, —COOM group-containing polyurea urethane, —COOM group-containing polyester, —COOM group-containing epoxy compound, —COOM group-containing polyamide acid, —COOM group-containing acrylonitrile-butadiene copolymer, —COOM group-containing styrene-butadiene-copolymer, —COOM group-containing polybutadiene, polyacrylamide, sodium polyacrylate, polyvinyl alcohol (PVA), carboxymethyl cellulose (CMC), hydroxyethyl cellulose (HEC), methyl cellulose (MC), polyethylene oxide, polyethylene imine, and derivatives thereof. They are not limitative.

The hydrophilic polymer may contain a compound to neutralize at least a portion of the carboxyl groups contained therein. Examples of such a compound include alkali metal hydroxide (such as lithium hydroxide, sodium hydroxide, and potassium hydroxide), alkali metal carbonate (such as lithium carbonate, potassium carbonate, and sodium carbonate), alkali metal alkoxide (such as potassium t-butoxide and sodium methoxide), polyvalent metal oxide (such as calcium hydroxide, magnesium hydroxide, and aluminum hydroxide), polyvalent metal alkoxide (such as aluminum isopropoxide), tertiary amine (such as triethylamine and tri-n-propylamine), secondary amine (such as diethylamine and di-n-propylamine), primary amine (such as ethylamine and n-propylamine), cyclic amine (such as morpholine), amino group-containing (meth)acrylate (such as N,N-dimethylaminoethyl (meth) acrylate and N,N-diethylaminoethyl (meth) acrylate), and ammonium salt (such as ammonium carbonate). They may be used alone or in combination with one another.

Incidentally, the hydrophilic polymer may contain, in addition to —COOM groups, polyoxyalkylene chains as the hydrophilic moiety and ethylenic unsaturated groups which function as a cross-linking agent.

The hydrophilic polymer as component (B) may be combined with a polymer having hydrophilic groups (such as hydroxyl group, amino group, and sulfone group) and/or polyoxyalkylene chains.

The content of component (B) in the photosensitive resin composition should be 5–50 wt %, preferably 7–40 wt %, and most desirably 7–30 wt %, for affinity for an aqueous developing solution and resistance to an aqueous ink.

According to the present invention, it is essential than the content of component (B) in the photosensitive resin composition should be smaller than that of component (A). Otherwise, the resulting finished printing plate is poor in resistance to an aqueous ink.

Component (C) in the photosensitive resin composition of the present invention is an ethylenic unsaturated compound having at least one terminal ethylenic group. This compound forms a polymer through chain growth addition polymerization which is initiated by a free radical. One of the ethylenic unsaturated compound suitable in the present invention is an unsaturated ester of a polyol, especially an unsaturated ester of a polyol with an α-methylcarboxylic acid, whose examples are enumerated below.

Ethylene glycol di(meth)acrylate, diethylene glycol di(meth)acrylate, glycerol diacrylate, 1,3-propanediol di(meth)acrylate, 1,4-butanediol di(meth)acrylate, 1,2,4-butanetriol tri(meth)acrylate, 1,4-cyclohexanediol di(meth)acrylate, 1,6-hexanediol di(meth)acrylate, trimethylolpropane tri(meth)acrylate, diallyl phthalate, diethyl phthalate, and dibutyl maleate. Additional examples include N-substituted maleimide compounds (such as N-methylmaleimide, N-ethylmaleimide, and N-laurylmalemimde), and oligo (meth)acrylates (such as oligonitrile-butadiene di(meth)acrylate, oligonitrile-urethane (meth)acrylate, oligourethane di(meth)acrylate, oligobutadiene di(meth)acrylate, and oligobutadiene-urethane di(meth)acrylate.

The content of component (C) in the photosensitive resin composition should be 1–50 wt %, preferably 5–40 wt %. With an amount less than 1 wt %, the resin composition does not undergo satisfactory photopolymerization, with the result that no image is formed after development. Inversely, with an amount in excess of 50 wt %, the resin composition is poor in shape retention and is inadequate for flexographic printing plates because it becomes hard and brittle after exposure to light.

Component (D) in the photosensitive resin composition of the present invention is a solvent which dissolves component (B) more than component (A). It is a highly polar solvent which swells, disperses, and dissolves a hydrophilic polymer as component (B) but swells a hydrophobic polymer as component (A) to a less extent. Examples of such a solvent include water and alcohols having 1–5 carbon atoms. Water may contain a surface active agent (such as sodium alkylbenzenesulfonate, sodium alkylnaphthalenesulfonate, sodium alkylsulfonate, and sodium alkylether sulfonate), a fatty acid, an alkali (such as lithium hydroxide, potassium hydroxide, and sodium hydroxide), or a salt (such as sodium borate, sodium carbonate, sodium acetate, and magnesium acetate). Examples of the alcohol include methyl alcohol, ethyl alcohol, propyl alcohol, isopropyl alcohol, butyl alcohol, isobutyl alcohol, t-butyl alcohol, pentyl alcohol, and neopentyl alcohol. Additional examples of the solvent which meets the requirement of component (D) include ester solvents, ketone solvents, and amide solvents, such as ethyl acetate, butyl acetate, isobutyl acetate, methyl cellosolve, ethyl cellosolve, acetone, methyl ethyl ketone, methyl butyl ketone, formamide, dimethylformamide, and dimethylacetamide. They may be used alone or in combination with one another.

The content of component (D) in the photosensitive resin composition should be 0.001–5 wt %, preferably 0.001–2.0 wt %, so that the composition provides a satisfactory flexographic printing plate. With a content in excess of 5 wt % the resin composition provides a printing plate stock which is soft and subject no cold flow and plastic deformation before photopolymerization. This leads to deformed reliefs (so-called low spots) after plate making, which are an obstacle to sharp images.

Component (E) in the photosensitive resin composition of the present invention is a photopolymerization initiator such as benzophenones, benzoins, acetophenones, benzils, benzoin alkyl ethers, benzyl alkyl ketals, anthraquinones, and thioxanthones. Specific examples include benzophenone, chlorobenzophenone, bonzoin, acetophenone, benzil, benzoin, methyl ether, benzoin ethyl ether, benzoin isopropyl ether, benzoin isobutyl ether, benzyl dimethyl ketal, benzyl diethyl ketal, benzyl di-isopropyl ketal, anthraquinone, 2-chloroanthraquinone, thioxanthone, and 2-chlorothioxanthone.

The content of component (E) in the photosensitive resin composition should be 0.01–5 wt %, preferably 0.1–3 wt %. With a content less than 0.01 wt %, the resin composition does not readily undergo photopolymerization. With a content in excess of 5 wt %, the resin composition itself prevents the penetration of light necessary for the curing to a desired depth. This gives rise to images which are easily chipped off during development.

The photosensitive resin composition of the present invention may optionally contain, in addition to the above-mentioned essential components (A) to (E), 0.001–5 wt % of heat polymerization inhibitor as component (F), which prevents heat polymerization without suppressing the photo-crosslinking reaction. Examples of the heat polymerization inhibitor include hydroquinone, hydroquinone monoethyl ether, catechol, p-t-butyl catechol, 2,6-di-t-butyl-p-cresol.

The photosensitive resin composition of the present invention may be incorporated with a liquid rubber (such as liquid polybutadiene, liquid polyacrylonitrile butadiene rubber, liquid polystyrene butadiene rubber, and liquid isoprene rubber) or comparatively low molecular weight elastomer (such as polyvinyl chloride, chlorinated polyethylene, and chlorinated polypropylene) as a plasticizer and a fine powder (such as silica and diatomaceous earth).

The photosensitive resin composition of the present invention is made into a printing plate stock in the following manner. First, the above-mentioned components are dissolved (in any order) and mixed in an adequate solvent or component (D) such as tetrahydrofuran, dioxane, methyl ethyl ketone, toluene cyclohexanone, chloroform, water, alcohol, which swells, disperses, and dissolves the hydrophilic polymer. After solvent removal, the resulting mixture is applied, with heating under pressure, to a substrate film such as polyester, polyethylene, and polypropylene.

In any state of the production of the photosensitive resin layer, the component (D) is removed so as to be a content of 0.001–2% by weight in order to form the phase structure of the present invention. The means for removal of the component (D) is not limited to any particular one, and there may be used, for example, a method wherein the removal is effected while stirring and mixing the various components (A), (B), (C), (D) and (E) or a method wherein the removal is effected by freeze-drying. If desired, the component (D) may be used in the desired small amount from the beginning so that it is mixed in apparently solid state.

The layer of the mixture may be covered with the same film as the substrate or a film coated or laminated with a thin layer of polyvinyl alcohol, polyacrylamide, or hydroxypropyl cellulose which is soluble in an aqueous developing solution. Finally, the top layer is provided with a peelable cover layer of plastics film, preferably polyester film.

The thus prepared printing plate stock of photosensitive resin composition is cured by exposure to ultraviolet rays having a wavelength of 150–500 nm, preferably 300–400 nm, which is emitted by a light sources such as low-pressure mercury lamp, high-pressure mercury lamp, carbon arc lamp, ultraviolet fluorescent lamp, chemical lamp, xenone lamp, and zirconium lamp.

The exposure is accomplished through a negative film (having a transparent image) placed on the printing plate stock. After exposure, the printing plate stock is developed with a developing solution at about 25°–45° C. to remove the unexposed non-image part. Thus there is obtained a finished printing plate of the present invention which has a shard relief image.

The development may be accomplished with water (including tap water) having pH 5.0–9.0, which may contain an alkaline compound (such as sodium hydroxide and sodium carbonate), surface active agent, and water-soluble organic solvent. The most adequate surface active agent is sodium alkylnaphthalenesulfonate or sodium alkylbenzenesulfonate. It is also possible to use anionic, nonionic, cationic, and amphoteric surface active agents.

The printing plate stock and finished printing plate of photosensitive resin in the present invention are characterized by the phase structure, which is easily formed when a solvent or component (D) which swells the hydrophilic polymer and another solvent which swells the hydrophobic solvent are used in a proper ratio, as mentioned above. The phase structure may also be formed by mixing the photosensitive resin composition with fine particles having a specific structure as defined in the present invention, which may previously be prepared by emulsion polymerization, melt extrusion, and mill blend. These methods are not limitative.

The thus prepared printing plate stock and finished printing plate of the present invention have the photosensitive resin layer of two-phase structure, one (uniformly mixed matrix phase) being composed mainly of a hydrophobic polymer, the other (dispersed phase) being composed of particles surrounded by a phase composed mainly of a hydrophilic polymer. The particles may be present in the form of aggregate.

The particles should be present in a density (number of particles) higher than $1 \times 10^2$ per cm$^2$, preferably higher than $1 \times 10^3$ per cm$^2$, and most desirably more than $1 \times 10^4$ per cm$^2$. It is essential that the particles should be surrounded by a phase composed mainly of a hydrophilic polymer, although the phase in the individual particles may contain any components in any ratio.

The particle may has any particle diameter and particle size distribution. A particle diameter desirable from the standpoint of dissolving power and development performance is in the range of one-thousandth to hundreds of micrometers.

The above-mentioned phase structure can be observed under a microscope, as shown in FIG. 1, if the photosensitive resin layer is stained with an adequate dye. It should be noted that each particle has at its center the phase (I) composed mainly of a hydrophobic polymer and the phase (I) is surrounded by the phase (II) composed mainly of a hydrophilic polymer. However, there may be an instance in which the hydrophobic polymer is not easily observed, as shown in FIG. 2, when the hydrophilic polymer accounts for a large portion in each particle or the particles are small in diameter.

Figure 2:
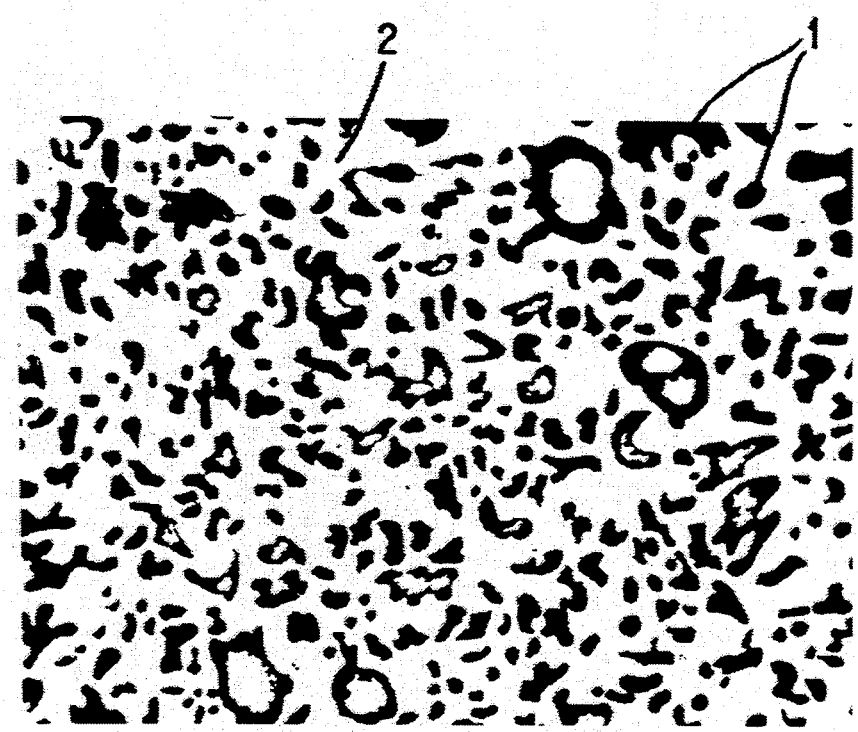

FIGS. 1 and 2 are microphotographs (about 300×) showing a cross-section of the resin layer of the printing plate stock (or finished printing plate). Reference numeral 1 (FIG. 1) or 2 (FIG. 2) indicates the phase composed mainly of a hydrophobic polymer, and reference numeral 2 (FIG. 1) or 1 (FIG. 2) indicates the phase composed mainly of a hydrophilic polymer.

As mentioned above, the photosensitive resin composition of the present invention provides a photosensitive printing plate which has rubber elasticity and is useful for flexographic printing owing to its good ink resistance, ink transfer performance, and plate wear. The photosensitive resin composition will also find use in the field of photoresist and sandblast. Additional possible applications include elastomer-based adhesive, film, and paint which can be cured by irradiation with ultraviolet rays.

The printing plate stock and finished printing plate of the present invention are characterized by the phase structure made up of a matrix phase and a dispersed phase, said matrix phase being composed of a hydrophilic component and a hydrophobic component, said dispersed phase being particles composed mainly of a hydrophobic polymer and surrounded by a phase composed mainly of a hydrophilic polymer. At the time of development, the matrix phase and the phase composed mainly of a hydrophilic polymer which surrounds the particles (of the dispersed phase) absorb water, swell, and disperse, causing the hydrophobic polymer constituting the dispersed phase to be dispersed into the developing solution. This phase structure permits the amount of the hydrophobic polymer to be increased and hence permits the development with water even when the content of the hydrophilic polymer is decreased. The reduction of the content of the hydrophilic component leads to the improvement of relief parts in resistance to aqueous ink.

The above-mentioned phase structure is formed by dissolving and mixing the components of the photosensitive resin composition in a solvent and forming the mixture into a sheet after solvent removal, as explained above. In the course of these steps, the hydrophilic polymer swells, disperses, and dissolves. It is necessary to add a solvent which moderately swells and dissolves polymers having a glass transition temperature lower than 5° C. Such a solvent forms the phase structure that permits development with water, and this, in turn, permits the reduction of the amount of the hydrophilic polymer and hence improves the resistance to aqueous ink.

EXAMPLES

The invention will be described in more detail with reference to the following examples, which are not intended to restrict the scope of the invention.

In examples, quantities are expressed as parts by weight. The printing plate stock and finished printing plate prepared from the composition of the present invention were nested for hardness and impact resilience according to the following methods.

Hardness: Measured at 20° C. according to JIS K6301 (Method A) using a spring hardness tester.

Impact resilience: Expressed in terms of $(a/20) \times 100\%$, where "a" stands for the height (cm) of bounce reached by a steel ball (10 mm in diameter, weighing 4.16 g) which has been dropped from a height of 20 cm.

The printing plate stock and finished printing plate were also examined for phase structure in the following manner. The photosensitive resin layer on the printing plate stock and finished printing plate was cut into 2-$\mu$m thick sections using a cryomicrotome (Reihert Ultracut N) at $-60°$ C. The sections were exposed to $OsO_4$ vapor for staining except the hydrophobic polymer. The stained sections were observed under a reflection microscope and the phase structure was examined by local analysis by the FT-IR microscopic method (BIOLAD Digilab FTS-40/UMA-300). The sections were also dipped in a 1.0% aqueous solution of primocyanine (crystal violet) at 25° C. for 30 minutes for the selective staining of the hydrophilic polymer. The stained sections were observed under a reflection microscope.

The amount of the remaining solvent was measured by the following method:

(1) Water: Measured by coulometric titration system with the use of digital micro moisture measuring apparatus (CA-02, Mitsubishi Kasei Kogyo K.K.)

(2) Methanol: Measured by gas chromatography with the use of G 180 Column Polapack of K.K. Yanagimoto Seisakusho.

Example 1

In a 1-liter flask equipped with a stirrer was placed a solution in tetrahydrofuran (300 parts) of hexamethylene diisocyanate (21.8 parts), dimethylol propionic acid (15.4 parts), polytetramethylene glycol (PG-100, made by Nippon Polyurethane Industry Co., Ltd.) (7.6 parts), and di-n-butyltin dilaurate (1.0 part). The flask was heated to 65° C. with stirring, and reaction was carried out for 3 hours. To the flask which had been cooled to room temperature was added with stirring a solution in methyl ethyl ketone (100 parts) of terminal amino group-containing acrylonitrile-butadiene oligomer (Hycar ATBNX 1300$\times$16, made by Ube Industries, Ltd.) (55.3 parts). The resulting polymer solution was dried under reduced pressure to remove tetrahydrofuran and methyl ethyl ketone. Thus there was obtained a polymer having a number-average molecular weight of 21,000.

This polymer (100 parts) was dissolved in methyl ethyl ketone (100 parts). To this solution was added with stirring a solution in methyl alcohol (100 parts) of lithium hydroxide (4.8 parts) at room temperature. Stirring was continued for 30 minutes. Thus there was obtained a hydrophilic polymer [I].

The hydrophilic polymer [I] (10 parts) and the following components were dissolved and dispersed in toluene (40 parts) and water (10 parts).

Chlorinated polyethylene (H-135, made by Osaka Soda Co., Ltd.) (45 parts), as a hydrophobic polymer
Styrene-butadiene rubber (SBR 1507, made by Japan Synthetic Rubber Co., Ltd. ) (15 parts)
Butadiene oligoacrylate (PB-A, made by Kyoeisha Yushi Co., Ltd.) (28.5 parts)
Benzyl dimethyl ketal (Irgacure 651, made by Ciba-Geigy Co., Ltd.) (1 part)
Hydroquinone monomethyl ether (0.5 part)

The resulting mixture was kneaded and deaerated at 150° C. using a kneader. Thus there was obtained a photosensitive resin composition. This resin composition was sandwiched between two sheets of polyester film (125 $\mu$m thick), one having no coating and the other having a 2-$\mu$m thick coating of polyvinyl alcohol, with the coating in contact with the resin composition. The sandwiching was carried out at 105° C. under a pressure of 100 kg/cm$^2$ for 1 minute using a hot press. Thus there was obtained a 2.8-mm thick sheet as the printing plate stock.

The coated polyester film was peeled off, with the coating layer of polyvinyl alcohol remaining on the photosensitive resin layer. The photosensitive resin layer was exposed through a negative film closely attached thereto. The exposure was carried out for 5 minutes at an illuminous intensity of 25 W/m$^2$ using a mercury lamp (made by Dainippon Screen Co., Ltd.). With the negative film removed, the exposed photosensitive resin layer was developed at 40° C. for 15 minutes with neutral water containing 2 wt % of sodium alkylnaphthalenesulfonate using a brush. Thus there was obtained a finished printing plate having an image pattern of relief 1.2 mm deep. It was found than this image pattern was a faithful reproduction of the image of the negative film. It was also found that the relief was good in ink receptivity and ink transfer performance and gave a sharp image.

The thus obtained relief was cut into 2-$\mu$m thick sections at $-60°$ C. using a cryomicrotome (Reihert Ultracut N). The sections were stained with $OsO_4$ vapor and observed under a reflection microscope. They were also examined for the phase structure by local analysis by the FT-IR microscopic method (BIOLAD Digilab FTS-40/UMA-300). It was found that staining did not took place in the chlorinated polyethylene (as the hydrophobic component) but took place in other components containing the hydrophilic component and butadiene component.

It was found that the dispersed phase was composed of particles which are ten to several tens of micrometer in diameter, and that each particle was composed of a stained phase (several micrometers) and an unstained phase. It was also found that the continuous phase was stained.

The results of IR analysis indicated that both the dispersed phase and the continuous phase contained chlorinated polyethylene (as a hydrophobic component) and a butadiene component containing a hydrophilic component, but the continuous phase contained more butadiene component than the dispersed phase.

The printing plate stock (in the form of sheet) and the finished printing plate (in the form of relief) were immersed for 30 minutes in a 1.0% aqueous solution of primocyanine (crystal violet) and then cut into 2-$\mu$m thick sections using a cryomicrotome (Reihert Ultracut N). The sections were observed under a reflection microscope. The results are shown in FIG. 1. It is noted that the hydrophilic polymer [I] was selectively stained and that staining also took place in the limited internal part, the periphery, and the continuous phase of the particles as large as those which were stained with $OsO_4$ as mentioned above.

Example 2

The same procedure as in Example 1 was repeated except that the formulation was partly changed as follows:

Chlorinated polyethylene: 35.8 parts
Styrene-butadiene rubber: 10.8 parts
Butadiene oligoacrylate: 36.0 parts The printing plate stock and finished printing plane obtained in this example were examined by staining the photosensitive resin layer with crystal violet. Microscopic observation revealed the phase structure as shown in FIG. 2.

Example 3

The same procedure as in Example 1 was repeated except that the lithium hydroxide (4.8 parts) in the hydrophilic polymer [I] was replaced by sodium hydroxide (4.56 parts). It was found that the resulting relief pattern was a faithful reproduction of the image of the negative film and that the relief was good in ink receptivity and ink transfer performance.

Staining with $OsO_4$ and crystal violet and microscopic observation were performed in the same manner as in Example 1. The same phase structure as in Example 1 was observed.

Example 4

The same procedure as in Example 1 was repeated except that the lithium hydroxide (4.8 parts) in the hydrophilic polymer [I] was replaced by N,N-dimethylethyl methacrylate (17.9 parts). It was found that the resulting relief pattern was a faithful reproduction of the image of the negative film and that the relief was good in ink receptivity and ink transfer performance.

Staining with $OsO_4$ and crystal violet and microscopic observation were performed in the same manner as in Example 1. The same phase structure as in Example 1 was observed.

Example 5

The same procedure as in Example 1 was repeated except that the lithium hydroxide (4.8 parts) in the hydrophilic polymer [I] was replaced by lithium hydroxide (2.4 parts) and magnesium acetate (6.1 parts). It was found that the resulting relief pattern was a faithful reproduction of the image of the negative film and that the relief was good in ink receptivity and ink transfer performance.

Example 6

The same procedure as in Example 1 was repeated except that the hydrophilic polymer [I] was replaced by polyisoprene containing sodium-chlorocarboxylate groups ("Kuraprene LIR-840" made by Kuraray Co., Ltd.). It was found that the resulting relief pattern was a faithful reproduction of the image of the negative film and that the relief was good in ink receptivity and ink transfer performance.

Staining with $OsO_4$ and crystal violet and microscopic observation were performed in the same manner as in Example 1. The same phase structure as in Example 1 was observed.

Example 7

The same procedure as in Example 1 was repeated except that the hydrophilic polymer [I] was replaced by nitrilebutadiene rubber containing sodium-chlorocarboxylate groups ("Sodium chloro-NIPOL 1072" made by Nippon Zeon Co., Ltd.). It was found that the resulting relief pattern was a faithful reproduction of the image of the negative film and that the relief was good in ink receptivity and ink transfer performance.

Staining with $OsO_4$ and crystal violet and microscopic observation were performed in the same manner as in Example 1. The same phase structure as in Example 1 was observed.

Example 8

The same procedure as in Example 1 was repeated except that the hydrophilic polymer [I] was replaced by styrene-butadiene rubber containing sodium-chlorocarboxylate groups ("SN-307" made by Sumitomo Naugatuck Co., Ltd.). It was found that the resulting relief pattern was a faithful reproduction of the image of the negative film and that the relief was good in ink receptivity and ink transfer performance.

Staining with $OsO_4$ and crystal violet and microscopic observation were performed in the same manner as in Example 1. The same phase structure as in Example 1 was observed.

Example 9

The same procedure as in Example 1 was repeated except that the chlorinated polyethylene was replaced by epichlorohydrin rubber ("Epichlomer H" made by Osaka Soda Co., Ltd.). It was found that the resulting relief pattern was a faithful reproduction of the image of the negative film and that the relief was good in ink receptivity and ink transfer performance.

Staining with $OsO_4$ and crystal violet and microscopic observation were performed in the same manner as in Example 1. The same phase structure as in Example 1 was observed.

Example 10

The same procedure as in Example 1 was repeated except that the chlorinated polyethylene was replaced by styrene-butadiene-styrene block copolymer ("Krayton 1101" made by Shell Sekiyu Kagaku Co., Ltd.). It was found that the resulting relief pattern was a faithful reproduction of the image of the negative film and that the relief was good in ink receptivity and ink transfer performance.

Staining with $OsO_4$ and crystal violet and microscopic observation were performed in the same manner as in Example 1. The same phase structure as in Example 1 was observed.

Example 11

The same procedure as in Example 1 was repeated except that the formulation was partly changed as follows:

Hydrophilic polymer [I] (7.5 parts)
Chlorinated polyethylene (H-135, made by Osaka Soda Co., Ltd.) (47.45 parts)
Styrene-butadiene rubber (SBR 1507, made by Japan Synthetic Rubber Co., Ltd.) (15 parts)
Butadiene oligoacrylate (PB-A, made by Kyoeisha Yushi Co., Ltd.) (28.5 parts)

Benzyl dimethyl ketal (Irgacure 651, made by Ciba-Geigy Co., Ltd.) (1 part)

Hydroquinone monomethyl ether (0.5 part)

It was found that the resulting relief pattern was a faithful reproduction of the image of the negative film and that the relief was good in ink receptivity and ink transfer performance.

Staining with $OsO_4$ and crystal violet and microscopic observation were performed in the same manner as in Example 1. The same phase structure as in Example 1 was observed.

Example 12

The same procedure as in Example 1 was repeated except that the water was replaced by methyl alcohol. It was found that the resulting relief pattern was a faithful reproduction of the image of the negative film and that the relief was good in ink receptivity and ink transfer performance.

Staining with $OsO_4$ and crystal violet and microscopic observation were performed in the same manner as in Example 1. The same phase structure as in Example 1 was observed.

Example 13

The same procedure as in Example 4 was repeated except that the water was replaced by methyl alcohol. It was found that the resulting relief pattern was a faithful reproduction of the image of the negative film and that the relief was good in ink receptivity and ink transfer performance.

Staining with $OsO_4$ and crystal violet and microscopic observation were performed in the same manner as in Example 1. The same phase structure as in Example 1 was observed.

Referential Example

Table 1 shows the developing speed, hardness, and impact resilience of the reliefs obtained in Examples 1 to 13 mentioned above.

TABLE 1

| Example | Developing speed ($\mu$m/15 min) | Hardness (Shore A) | Impact resilience (%) | Remaining solvent (wt %) |
|---|---|---|---|---|
| 1 | 1300 | 58 | 35 | 0.70 |
| 2 | 1100 | 63 | 30 | 1.30 |
| 3 | 1300 | 58 | 35 | 0.83 |
| 4 | 1300 | 57 | 35 | 1.21 |
| 5 | 1200 | 57 | 35 | 0.50 |
| 6 | 900 | 58 | 30 | 1.50 |
| 7 | 1000 | 58 | 30 | 1.71 |
| 8 | 1000 | 60 | 30 | 1.25 |
| 9 | 1300 | 58 | 35 | 0.50 |
| 10 | 1200 | 58 | 35 | 1.10 |
| 11 | 900 | 58 | 30 | 1.25 |
| 12 | 1300 | 58 | 35 | 0.80 |
| 13 | 1200 | 57 | 35 | 0.75 |

What is claimed is:

1. A method for producing a photosensitive resin layer containing (A) a hydrophobic polymer having a glass transition temperature not higher than 5° C., selected from the group consisting of polymers obtained by the polymerization of a conjugated diene hydrocarbon, copolymers obtained by the copolymerization of a conjugated diene hydrocarbon with a monoolefinic unsaturated compound, elastomers containing a chlorine and polymers of non-conjugated diene hydrocarbon, (B) a hydrophilic polymer which has a hydrophilic substituent selected from the group consisting of —OH, —$NH_2$, —COOM and —$SO_3M$ where M denotes a hydrogen atom, an element from Groups I, II and III of the Periodic Table. amine or ammonium, (C) an ethylenically unsaturated compound, (D) a solvent capable of dissolving said component (B) more than said component (A), selected from the group consisting of water and alcohols having 1–5 carbon atoms, the water optionally containing a surface active agent, fatty acid, alkali or salt, and (E) a photopolymerization initiator, which comprises removing the component (D), at any stage of the production, to a content of 0.001–2% by weight, to provide a structure which includes a dispersed phase, which includes particles which comprise a phase which consists mainly of the hydrophobic polymers, surrounded by a phase which consists mainly of the hydrophilic polymer.

2. A method according to claim 1, wherein the removal of the component (D) is effected while stirring and mixing the components (A), (B), (C), (D) and (E).

3. A method according to 1, wherein the ethylenically unsaturated compound is an unsaturated ester of a polyol.

4. A method according to claim 1, wherein the photopolymerization initiator is selected from the group consisting of benzophenones, benzoins, acetophenones, benzyls, benzoin alkyl ethers, benzyl alkyl ketals, anthraquinones and thioxanthones.

5. A method according to claim 1, wherein an element belonging to Groups I, II and III is selected from the group consisting of lithium, sodium, potassium, calcium, magnesium and aluminum.

6. A method according to claim 1, wherein the amine is selected from the group consisting of triethylamine, tri-n-propylamine, diethylamine, di-n-propylamine, ethylamine, n-propylamine, morpholine, and N,N-dimethylaminoethyl (meth)acrylate and N,N-diethylaminoethyl(meth)acrylate.

* * * * *